(12) United States Patent
Leschkies et al.

(10) Patent No.: US 10,096,516 B1
(45) Date of Patent: Oct. 9, 2018

(54) METHOD OF FORMING A BARRIER LAYER FOR THROUGH VIA APPLICATIONS

(71) Applicant: Applied Materials, Inc., Santa Clara, CA (US)

(72) Inventors: Kurtis Leschkies, San Jose, CA (US); Steven Verhaverbeke, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/681,320

(22) Filed: Aug. 18, 2017

(51) Int. Cl.
*H01L 21/768* (2006.01)
*H01L 21/02* (2006.01)

(52) U.S. Cl.
CPC .. *H01L 21/76898* (2013.01); *H01L 21/02304* (2013.01); *H01L 21/76831* (2013.01)

(58) Field of Classification Search
CPC ................................................ H01L 21/02304
See application file for complete search history.

(56) References Cited

U.S. PATENT DOCUMENTS

| | | | |
|---|---|---|---|
| 5,879,756 A | 3/1999 | Fathi et al. | |
| 6,319,766 B1* | 11/2001 | Bakli | C23C 16/0281 257/E21.274 |
| 7,460,760 B2 | 12/2008 | Cho et al. | |
| 7,503,334 B1 | 3/2009 | Shrinivasan et al. | |
| 7,521,378 B2 | 4/2009 | Fucsko et al. | |
| 7,867,923 B2 | 1/2011 | Mallick et al. | |
| 8,027,089 B2 | 9/2011 | Hayashi | |
| 8,318,584 B2 | 11/2012 | Li et al. | |
| 8,349,085 B2 | 1/2013 | Tahara et al. | |
| 8,449,942 B2 | 5/2013 | Liang et al. | |
| 8,481,123 B2 | 7/2013 | Kim et al. | |
| 8,557,712 B1 | 10/2013 | Antonelli et al. | |
| 8,741,788 B2 | 6/2014 | Liang et al. | |
| 8,936,834 B2 | 1/2015 | Kim et al. | |
| 9,257,314 B1 | 2/2016 | Rivera et al. | |
| 9,306,026 B2 | 4/2016 | Toriumi et al. | |
| 2001/0029108 A1 | 10/2001 | Tometsuka | |
| 2003/0030945 A1* | 2/2003 | Heinonen | B82Y 10/00 360/324.2 |
| 2005/0003655 A1* | 1/2005 | Cathey | C23C 16/403 438/627 |
| 2010/0327422 A1* | 12/2010 | Lee | H01L 21/76898 257/690 |
| 2013/0337171 A1 | 12/2013 | Sasagawa | |

(Continued)

FOREIGN PATENT DOCUMENTS

| | | |
|---|---|---|
| JP | 2013516788 A | 5/2013 |
| KR | 1020090040867 A | 4/2009 |
| KR | 20150122432 A | 11/2015 |

*Primary Examiner* — Mounir Amer
(74) *Attorney, Agent, or Firm* — Patterson + Sheridan LLP

(57) ABSTRACT

Embodiments of the disclosure generally relate to a method of improving quality of a barrier layer suitable for forming high aspect ratio through substrate vias. In one example, a method for depositing a barrier layer includes depositing a barrier layer in a hole formed in a substrate, exposing the deposited barrier layer to a processing gas at a pressure greater than about 2 bars, and, maintaining a temperature of the substrate between about 150 degrees and about 700 degrees Celsius while in the presence of the processing gas.

18 Claims, 3 Drawing Sheets

(56) References Cited

U.S. PATENT DOCUMENTS

| | | |
|---|---|---|
| 2014/0231384 A1 | 8/2014 | Underwood et al. |
| 2014/0264237 A1* | 9/2014 | Chen .................... H01L 45/146 257/4 |
| 2014/0284821 A1 | 9/2014 | Hubbard |
| 2016/0260526 A1* | 9/2016 | Otto ....................... H01B 12/10 |
| 2016/0353522 A1 | 12/2016 | Rathi et al. |
| 2017/0160012 A1 | 6/2017 | Kobayashi et al. |

* cited by examiner

METHOD OF FORMING A BARRIER LAYER FOR THROUGH VIA APPLICATIONS

BACKGROUND

Field

Embodiments of the disclosure generally relate to fabrication of integrated circuits and particularly to a method of forming a barrier layer for through via structures.

Description of the Related Art

Current generation semiconductor devices, such as memory devices, logic devices, microprocessors etc., often utilized vertical electrical connections that pass completely through a substrate or die. Such vertical electrical connections are commonly known as through substrate vias, through silicon vias, and through vias. Through vias are typically formed through a silicon structure and filled with a conductive material, such as copper or tungsten. Since the electrons may readily pass into the silicon structure from the conductive material, a liner layer (e.g., barrier layer) formed from a dielectric material is utilized to provide a barrier to help insulate the conductive material from the silicon structure.

However, as semiconductor devices continue to shrink in size and grow in complexity, the aspect ratios of through via has become very high. Consequently, robustly depositing liner material in these high aspect ratio vias has become very challenging. Particularly, most conventional liner materials deposited in high aspect ratio vias experience poor hermeticity and rapid moisture absorption in as little as one hour. This causes portions of the liner to become electrically conductive at very low applied electric field, which is highly undesirable as electrons may then begin to flow between the conductively material and the silicon structure creating high parasitic current leakage.

Thus, there is a need for an improved liner for though via applications.

SUMMARY

Embodiments of the disclosure generally relate to a method of improving quality of a barrier layer suitable for forming high aspect ratio through substrate vias. In one example, a method for depositing a barrier layer includes depositing a barrier layer in a hole formed in a substrate, exposing the deposited barrier layer to a processing gas at a pressure greater than about 2 bars, and, maintaining a temperature of the substrate between about 150 degrees and about 700 degrees Celsius while in the presence of the processing gas.

In another example, a method of forming a through substrate via is provided. The method includes depositing a barrier layer in a hole formed in a feature side of a substrate, the feature side opposite a backside of the substrate, annealing the deposited barrier layer, maintaining a temperature of the substrate between about 150 degrees and about 700 degrees Celsius while in the presence of the processing gas, filling the hole with a conductive material disposed on the barrier layer, and thinning the substrate from the backside to expose the conductive material. Annealing the barrier layer may be accomplished by exposing the deposited barrier layer to a processing gas at a pressure greater than about 2 bars, and maintaining a temperature of the substrate between about 150 degrees and about 700 degrees Celsius while in the presence of the processing gas.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
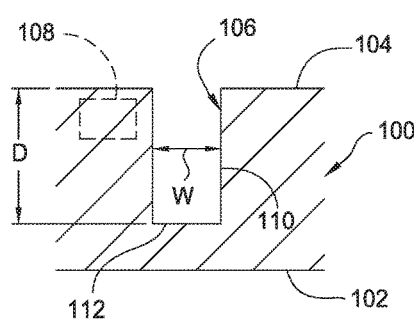
FIGS. 1A-1E are simplified cross-sectional views of a semiconductor substrate during various stages of a through substrate via fabrication process.

Embodiments of the disclosure generally relate to a method of improving quality of a barrier layer utilized in through substrate via applications. The barrier layer is deposited in a high aspect ratio via formed in a semiconductor substrate. A high aspect ratio via is generally defined as a via having a hole having a depth at least 10 times the diameter of the hole. As deposited, conventional oxide barrier layers, such $SiO_2$, generally have diminishing electrical properties toward the bottom of the via hole. Conventional annealing processes have shown to temporarily improve the electrical properties of the barrier layer at the bottom of the via hole, but such improvements are short lasting, and generally are gone by time the via is filled with metal. As disclosed herein, a high pressure anneal of the barrier layer has shown to significantly improve the electrical properties of the barrier layer for at least a few weeks, thus maintaining the barrier layer in a high quality state at least through metal fill. For example, the improvements in the electrical properties of the barrier layer have been demonstrated to last in excess of 1 week when exposed to ambient atmosphere. Some of the improvements include desification of the lower regions (closer to hole bottom) of the barrier layer, good hermeticity and low water absorption. The barrier layer is exposed to a processing gas under high pressure during the post-deposition annealing process. The processing gas penetrates deep into the film comprising the barrier layer to increase film density, add oxygen to vacancies within the film, and repair defects by replacing and/or completing bonding sites, thus enhancing the density and the quality of the film deposited on the substrate. An annealing chamber, such as but not limited to an annealing chamber illustrated in FIG. 3 and described below, can be utilized for performing the annealing process described herein. However, the method described herein can also be performed in other annealing chambers, including those configured to process a single substrate at a time.

FIGS. 1A-1E are simplified cross-sectional views of a semiconductor substrate 100 during various stages of a through substrate via fabrication process. FIG. 2 is a block diagram of a method 200 for forming a through substrate via corresponding to the sectional views of FIGS. 1A-1E. A portion of the method 200 includes forming a barrier layer having improved electrical properties relative to its as deposited form, wherein the improved electrical properties are maintained within the barrier layer for at least 24 hours without significant degradation.

The method 200 begins at operation 202 by forming a hole 106 in a substrate. The substrate, such as the substrate 100 depicted in FIG. 1A, has a feature side 104 and a backside 102. The feature side 104 is the side of the substrate 100 upon which devices are formed. The substrate 100 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 100 may have various dimensions, such as having a diameter of 200 mm, 300 mm, 450 mm or other diameter, as well as being a rectangular or square panel. In one example, the substrate 100 is a 200 mm diameter, a 300 mm diameter, or a 450 mm diameter silicon wafer.

The hole 106 is formed in the feature side 104 and extends towards but does not exit the backside 102 of the substrate. The hole 106 may be formed by laser drilling, plasma etching, or other suitable technique.

The hole 106 has a sidewall 110 and a bottom 112. The hole 106 has a depth D defined between the feature side 104 of the substrate 100 and the bottom 112 of the hole 106. In one example, the depth D is between about 100 to about 150 μm. The hole 106 has a width W defined between the sidewalls 110 of the hole 106. In one example, the width W is between about 1.0 to about 5.0 μm, wherein the width W is a diameter of hole 106. The depth D and width W define an aspect ratio. Although not drawn to scale, the hole 106 has a high aspect ratio (D:W) that is greater than or equal to 10:1, for example an aspect ratio greater than 20:1 or as much or more than 200:1. In others example, the aspect ratio of the hole 106 may have a lower aspect ratio.

In one example, the method 200 is performed as a "via last" process. For example, a device 108 (shown in phantom in FIG. 1A), such as a complementary metal-oxide-semiconductor (CMOS) structure or other integrated circuit (IC) structure, may be formed in or on the substrate 100 prior to formation of the hole 106 and the other operations of the method 200.

Figure 1B:
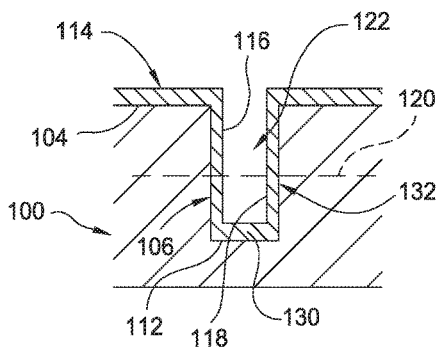
Figure 2:
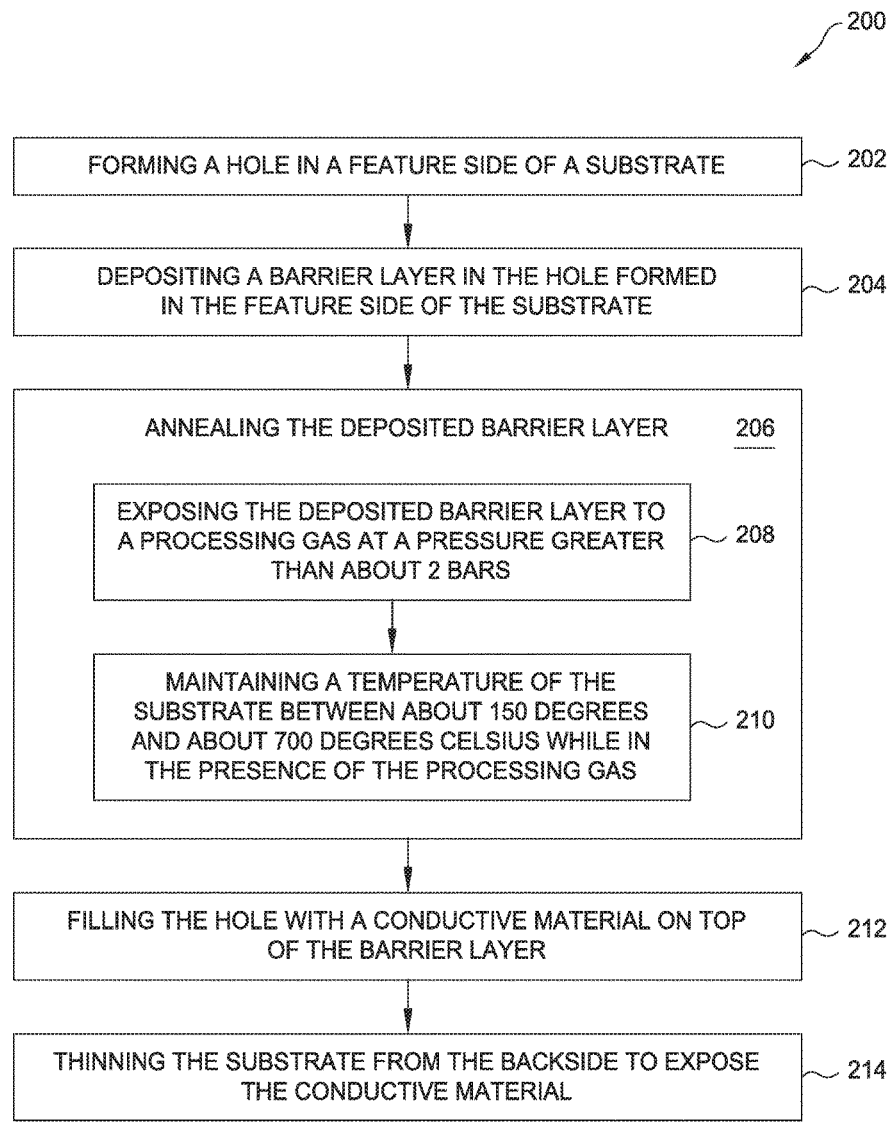
FIG. 2 is a block diagram of a method for forming a through substrate via corresponding to the sectional views of FIGS. 1A-1E.

At operation 204, a barrier layer 114 is conformally deposited on the feature side 104 of the substrate 100, as illustrated in FIG. 1B. In one example, the barrier layer 114 is a material selected to prevent current leakage through the barrier layer 114, such as an oxide. Other suitable barrier materials include metallic oxides, metallic nitrides, and metallic oxynitrides, or other suitable materials. In the example depicted in FIG. 1B, the barrier layer 114 is $SiO_2$. Metallic oxides suitable for use as the barrier layer 114 include, but are not limited to, $HfO_2$, $TiO_2$, $Ta_2O_5$, $Al_2O_3$ as well as other tertiary or higher-order compounds, $BaTiO_3$, $BaSrTiO_3$, $PbZrTiO_3$, $BaPbZrTiO_3$, and the like. Low-k materials that are also suitable for use as the barrier layer 114 include, but are not limited to SiN, SiC, $SiO_xN_y$, and amorphous silicon and hydrogen compounds, such as SiC:H, S—C—H film, Si—N—H, Si—O—H, Si—C—N—H, Si—O—C—H, Si—O—N—H, and the like. The barrier layer 114 may be deposited using a chemical vapor deposition (CVD) process, or other suitable deposition technique.

The deposited barrier layer 114 includes sidewalls 132 and a bottom 130 that conformally cover the sidewalls 110 and bottom 112 of the hole 106. An open space 122 is formed between the sidewalls 132 and the bottom 130 of the barrier layer 114.

As discussed above, it has been observed that the properties of the as deposited barrier layer 114 is not unformed along the sidewalls 132. For example, the properties of the deposited barrier layer 114 forming the sidewalls 132 may degrade at locations along the sidewalls 132 closer to the bottom 112 of the hole 106. Stated differently, the properties of the deposited barrier layer 114 exhibit a gradient that worsens towards the bottom of the hole 106. Although not to be bound by theory, lower portions 118 of the sidewalls 132 (for example below an imaginary line 120 bifurcating the sidewalls 132) exhibit less oxygen content as compared to upper portions 116 of the sidewalls 132 disposed above the imaginary line 120. The barrier material forming lower portions 118 of the sidewalls 132 may also exhibit more defects and incomplete bonding relative to the upper portions 116, believed primarily due to oxide vacancies in the oxide network comprising the barrier material.

Figure 1C:
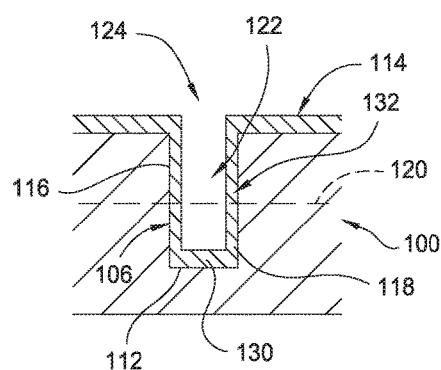

At operation 206, the barrier layer 114 is annealed to improve the properties of the barrier layer 114, particularly in the lower portions 118 of the sidewalls 132, as illustrated in FIG. 1C. For example, a high pressure annealing process may be performed to introduce a processing gas (represented by arrow 124) into the space 122 defined between the sidewalls 132 of the barrier layer 114. The high pressure processing gas 124 penetrates deep into the space 122 and penetrates the material comprising the sidewalls 132 of the barrier layer 114. The processing gas 124 includes oxygen which advantageously fills vacancies, repairs defects and completes bonding sites in the lattice of the barrier material, thus densifying the material comprising the barrier layer 114. Furthermore, due to the deep penetration of the processing gas 124 into the space 122 to the bottom 130 of the barrier layer 114, the barrier properties of the lower portion 118 of the sidewalls 132 are substantially improved, and may become substantially uniform with the barrier properties of the upper portion 116 of the sidewalls 132. Advantageously, the annealing operation 206 produces a barrier layer 114 having electrical properties that are substantially uniform in the sidewalls 132 along the depth D of the hole 106. That is, the electrical properties of the barrier material forming the sidewalls 132 no longer exhibit a gradient towards the bottom 112 of the hole 106 after the annealing operation 206.

Additionally, the processing gas 124 may also include an oxygen component having an oxygen isotope that is greater than an oxygen isotope found in the as deposited barrier layer 114. Thus, since the annealing operation 206 adds a heavier isotope oxygen component into the as deposited barrier layer 114, the annealed barrier layer 114 is much denser due to the incorporation of the heavier isotope oxygen into the lattice comprising the barrier layer 114.

Moreover, the annealing operation 206 may also replace some of the oxygen components present in the deposited barrier layer 114. Thus, since the annealing operation 206 replaces the oxygen component present in the as deposited barrier layer 114 with an oxygen component having a heavier isotope, the annealed barrier layer 114 is denser compared to the as deposited barrier layer 114. For example, the as deposited barrier layer 114 may be deposited with a ratio X of a lower oxygen isotope atoms to higher oxygen isotope atoms, while the annealed barrier layer 114 has a ratio Y of a lower oxygen isotope atoms to higher oxygen isotope atoms, where X is greater than Y. Thus, the resultant annealed barrier layer 114 contains a greater amount of oxygen with higher isotopes than the as deposited barrier layer 114. Moreover, the resultant annealed barrier layer 114 will maintain the greater level of high oxygen isotopes for at least for 2 and as much as 7 or more days, which is sufficient time to fill the space 122 with conductive material, such as metal, prior to significant degrading the electrical properties of annealed barrier layer 114.

The annealing operation 206 may be formed on a single substrate 100 or simultaneously on a batch of substrates 100. The annealing operation 206 may be performed in an annealing chamber, such as but not limited to an annealing chamber illustrated in FIG. 3. However, the annealing operation 206 may be performed in other suitably adapted annealing chambers.

The annealing operation 206 generally introduces a processing gas 124 that includes an oxygen component. The processing gas 124 may also include a hydrogen component. Exemplary processing gases 124 include at least one of ozone, oxygen, water vapor, heavy water, a peroxide, hydroxide-containing compounds, oxygen isotopes (14, 15, 16, 17, 18, etc.), and non-isotopes of oxygen and/or water. The peroxide may be hydrogen peroxide in gaseous phase. In some embodiments, the processing gas 124 is an oxidizer that comprises a hydroxide ion, such as but not limited to water vapor or heavy water in vapor form, e.g., steam. In one example, the processing gas 124 is in the form of dry steam or superheated steam. The temperature of annealing chamber in which the substrate 100 is processed is maintained at a temperature selected to prevent condensation of the processing gas 124. For example, the temperature of surfaces of the annealing chamber exposed to the processing gas is maintained at a temperature between about 100 to about 400 degrees Celsius.

During the annealing operation 206, the pressure of the processing gas 124 within the annealing chamber is maintained at a pressure greater than atmosphere at sub-operation 208. For example at sub-operation 208, the pressure of the processing gas 124 within the annealing chamber is maintained at a pressure greater than about 2 bars, such as for example, greater than 10 bars. In another example, the processing gas 124 within the annealing chamber is maintained at a pressure from about 10 to about 60 bars, such as from about 20 to about 50 bars. In another example, the processing gas 124 within the annealing chamber is maintained at a pressure up to about 200 bars.

During the annealing operation 206, the substrate 100 is maintained at an elevated temperature that is greater than a temperature of surfaces of the annealing chamber exposed to the processing gas 124 at sub-operation 210. For example at sub-operation 210, the substrate 100 may be maintained at a temperature between about 150 and about 700 degrees Celsius, such as between 200 and about 600 degrees Celsius or about 300 and about 450 degrees Celsius. In "via last" embodiment, the temperature of the substrate 100 is maintained below the thermal budget of the devices 108 formed on the substrate 100.

The substrate 100 is exposed to the processing gas 124 at the elevated temperature and pressure at the annealing operation 206 for a time sufficient to improve the electrical properties of the barrier layer 114. The annealed barrier layer 114 has significant improvement of electrical properties as compared to the as deposited barrier layer 114. Moreover, the improved electrical properties remain in the annealed barrier layer 114 for at least a few days, thus maintaining the barrier layer 114 in a high quality state at least through subsequent conductive material fill operations as further discussed below. For example, the improvements in the electrical properties of the annealed barrier layer 114 have been demonstrated to last in excess of 1 week when exposed to ambient atmosphere.

Figure 1D:
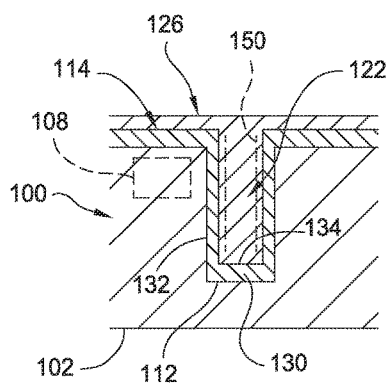

At operation 212, conductive material 126 is deposited over the annealed barrier layer 114 to fill the space 122, as illustrated in FIG. 1D. The conductive material 126 may be fabricated from a metal, such as tungsten, copper, other metal or other suitable conductive material. A portion of the conductive material 126 filling the space 122 includes a bottom 134 that is disposed in contact with the bottom 130 of the barrier layer 114. The conductive material 126 may be deposited using a conductive paste, physical vapor deposition (PVD), plating, or other suitable process. Shown in FIG. 1D, an optional seed layer 150 may be deposited on the barrier layer 114 prior to depositing the conductive material 126. The seed layer 150, such as copper deposited utilizing a chemical vapor deposition (CVD) or other suitable process, improves adhesion of the conductive material 126 particularly when the conductive material 126 is subsequently deposited using a plating process.

Figure 1E:
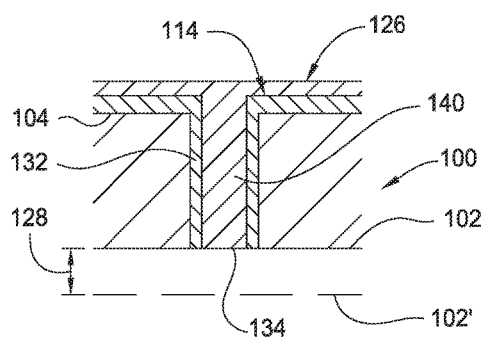

At operation 214, the substrate 100 is thinned to remove material from the backside 102 of the substrate 100 to expose the conductive material 126 filing the space 122. For example as illustrated in FIG. 1E, a thickness 128 of the substrate 100 is removed from the backside 102 of the substrate 100 (where the backside 102' represents the pre-thinned thickness of the substrate). The substrate 100 may be thinned by etching, grinding, polishing or other suitable technique. In the example illustrated in FIG. 1E, the substrate 100 is thinned using a chemical mechanical polishing (CMP) process. After thinning is complete, the bottom 134 of the conductive material 126 is exposed through the backside 102 of the substrate 100, thus forming a conductive via 140 through the substrate 100. Although not depicted in FIG. 1E, the portions of the barrier layer 114 and the conductive material 126 that overlay the feature side 104 may be removed, for example by etching.

In another implementation of the method 200, the device 108 may be fabricated after conductive material fill at operation 212 but prior to thinning at operation 214, such as illustrated in FIG. 1D (with the device 108 shown in phantom). Such implementations of the method 200 with device 108 formation after conductive material fill are commonly known as a "via first" process.

Figure 3:
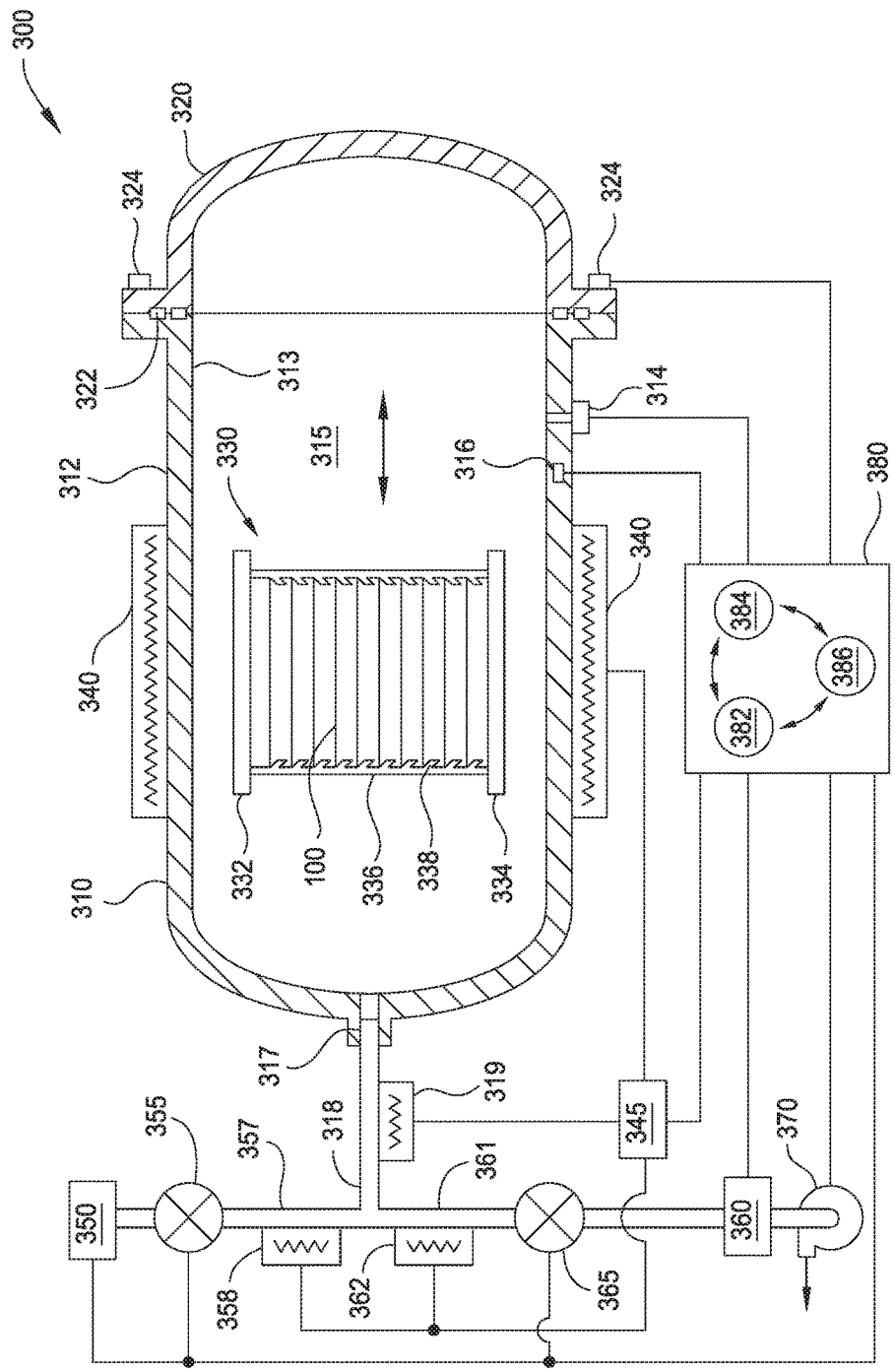
FIG. 3 is a simplified front cross-sectional view of an annealing chamber in which an annealing process of a through substrate via fabrication process may be performed.

FIG. 3 is simplified front cross-sectional view of an exemplary annealing chamber 300 suitable for practicing the method 200 described above. It is contemplated that other annealing chambers having other configurations may be utilized.

In the example depicted in FIG. 3, the annealing chamber 300 has a body 310 with an outer surface 312 and an inner surface 313 that encloses a processing region 315. In some embodiments such as shown in FIG. 3, the body 310 has an annular cross-section, although in other embodiments the cross-section of the body 310 may be rectangular or any closed shape. The outer surface 312 of the body 310 may be made from a corrosion resistant steel (CRS), such as but not limited to stainless steel. The inner surface 313 of the body 310 may be made from nickel-based steel alloys that exhibit high resistance to corrosion, such as but not limited to HASTELLOY®.

The annealing chamber 300 has a door 320 configured to sealably enclose the processing region 315 within the body 310. The processing region 315 can be accessed for transferring substrates 100 when the door 320 is open. A high-pressure seal 322 is utilized to seal the door 320 to the body 310 in order to seal the processing region 315 for processing. The high-pressure seal 322 may be made from a polymer, such as but not limited to a perflouroelastomer. A cooling channel 324 is disposed on the door 320 adjacent to the high-pressure seals 322 in order to maintain the high-pressure seals 322 below a maximum safe-operating temperature of the material comprising the seal 322. A cooling agent, such as a heat transfer fluid, may be circulated within the cooling channel 324 to maintain the high-pressure seals 322 below its maximum safe-operating temperature, such as between about 150 degrees Celsius and 250 degrees Celsius. The flow of the cooling agent within the cooling channel 324 is controlled by a controller 380 through feedback received from a temperature sensor 316 or a flow sensor (not shown).

The annealing chamber 300 has a port 317 formed through the body 310. The port 317 has a pipe 318 coupled thereto. The pipe 318 is interfaced with a heater 319. One end of the pipe 318 is connected to the processing region 315 through the port 317. The other end of the pipe 318 slits into an inlet conduit 357 and an outlet conduit 361. The inlet conduit 357 is fluidly connected to a gas panel 350 via an isolation valve 355. The inlet conduit 357 is coupled to a heater 358. The outlet conduit 361 is fluidly connected to a condenser 360 via an isolation valve 365. The outlet conduit 361 is coupled to a heater 362. The heaters 319, 358 and 362 are configured to maintain the processing gas (124) flowing through the pipe 318, inlet conduit 357 and the outlet conduit 361 at a temperature between the condensation point of the processing gas and about 300 degrees Celsius. The heaters 319, 358 and 362 are powered by a power source 345.

The gas panel 350 is configured to provide the processing gas 124 under pressure into the inlet conduit 357 for transmission into the processing region 315 through the pipe 318. The pressure of the processing gas 124 introduced into the processing region 315 is monitored by a pressure sensor 314 coupled to the body 310. The condenser 360 is fluidly coupled to a cooling fluid and configured to condense a gaseous product (the processing gas 124) flowing through the outlet conduit 361 after removal from the processing region 315 through the pipe 318. The condenser 360 converts the gaseous products from the gas phase into liquid phase. A pump 370 is fluidly connected to the condenser 360 and pumps out the liquefied products from the condenser 360. The operation of the gas panel 350, the condenser 360 and the pump 370 are controlled by the controller 380.

The isolation valves 355 and 365 are configured to allow only one fluid to flow through the pipe 318 into the processing region 315 at a time. When the isolation valve 355 is open, the isolation valve 365 is closed such that the processing gas 124 flowing through inlet conduit 357 enters into the processing region 315, preventing the flow of the processing gas 124 into the condenser 360. On the other hand, when the isolation valve 365 is open, the isolation valve 355 is closed such that a gaseous product is removed from the processing region 315 and flows through the outlet conduit 361, preventing the flow of the gaseous product into the gas panel 350.

One or more heaters 340 are disposed on the body 310 and configured to heat the processing region 315 within the annealing chamber 300. In some embodiments, the heaters 340 are disposed on an outer surface 312 of the body 310 as shown in FIG. 3, though in other embodiments, the heaters 340 may be disposed on an inner surface 313 of the body 310. Each of the heaters 340 may be a resistive heating element, a heating lamp, or other suitable heater. The heaters 340 are powered by the power source 345. Power to the heaters 340 is controlled by a controller 380 through feedback received from a temperature sensor 316. The temperature sensor 316 is coupled to the body 310 and monitors the temperature of the processing region 315.

A cassette 330 coupled to an actuator (not shown) is moved in and out of the processing region 315. The cassette 330 has a top surface 332, a bottom surface 334, and a wall 336. The wall 336 of the cassette 330 has a plurality of substrate storage slots 338. Each substrate storage slot 338 is evenly spaced along the wall 336 of the cassette 330. Each substrate storage slot 338 is configured to hold a single substrate 100 therein. The cassette 330 may have as many as fifty substrate storage slots 338 for holding the substrates 100. The cassette 330 provides an effective vehicle both for transferring a plurality of substrates 100 into and out of the annealing chamber 300 and for processing the plurality of substrates 100 in the processing region 315.

The controller 380 controls the operation of the annealing chamber 300 such that operation 206 of the method 200 is performed. The controller 380 controls the operation of the gas panel 350, the condenser 360, the pump 370, the isolation valves 355 and 365 as well as the power source 345. The controller 380 is also communicatively connected to the temperature sensor 316, the pressure sensor 314 and the cooling channel 324. The controller 380 includes a central processing unit (CPU) 382, a memory 384, and a support circuit 386. The CPU 382 may be any form of a general purpose computer processor that may be used in an industrial setting. The memory 384 may be a random access memory, a read-only memory, a floppy, or a hard disk drive, or other form of digital storage. The support circuit 386 is conventionally coupled to the CPU 382 and may include cache, clock circuits, input/output systems, power supplies, and the like.

The annealing chamber 300 provides a convenient chamber to perform the method 200 which improves the quality of the barrier layer 114 deposited on substrates 100 that are utilized for forming vias 140. The heaters 340 maintain exposed internal surfaces of the annealing chamber 300 at a temperature above the condensation point of the processing gas 124, and at a temperature less than about 300 degrees Celsius. The heaters 319, 358 and 362 also heat the pipe 318, the inlet conduit 357 and the outlet conduit 361 to a temperature above the condensation point of the processing gas so that the processing gas does not condensate within the pipe 318, the inlet conduit 357 and the outlet conduit 361.

As discussed above, the application of the processing gas at high pressure and temperature offers an advantage over the conventional annealing processes. Advantageously, the annealing process yields a dense barrier layer, having good hermeticity and low water absorption The processing gas utilized during the annealing process penetrates deep into the film comprising the barrier layer to increase film density, add oxygen to vacancies within the film, and repair defects by replacing and/or completing bonding sites, thus enhancing the density and the quality of the film deposited on the substrate. As a result, vias may be formed that advantageously demonstrates excellent resistance to current leakage and dielectric breakdown, thus enabling dense arrays of high aspect ratio vias to be utilized in next generation semiconductor devices.

While the foregoing is directed to particular embodiments of the present disclosure, it is to be understood that these embodiments are merely illustrative of the principles and applications of the present invention. It is therefore to be understood that numerous modifications may be made to the illustrative embodiments to arrive at other embodiments without departing from the spirit and scope of the present inventions, as defined by the appended claims.

What is claimed is:

1. A method for depositing a barrier layer, the method comprising:
   depositing a barrier layer in a hole formed in a substrate, wherein the hole has an aspect ratio of at least 10:1;
   exposing the deposited barrier layer to a processing gas at a pressure greater than about 2 bars; and
   annealing the deposited barrier layer by maintaining a temperature of the substrate between about 150 degrees and about 700 degrees Celsius while in the presence of the processing gas, wherein the annealing replaces oxygen atoms having a first isotope in the deposited barrier layer with oxygen atoms having a second isotope that is higher than the first isotope to densify the deposited barrier layer.

2. The method of claim 1, wherein exposing the deposited barrier layer to the processing gas further comprises:
   exposing the deposited barrier layer to the processing gas at a pressure greater than about 5 bars.

3. The method of claim 1, wherein exposing the deposited barrier layer to the processing gas further comprises:
   exposing the deposited barrier layer to the processing gas at a pressure between about 5 to about 60 bars.

4. The method of claim 1, wherein maintaining the temperature of the substrate further comprises:
   maintaining the temperature of the substrate between 150 and about 600 degrees Celsius.

5. The method of claim 1, wherein depositing the barrier layer further comprises:
   depositing at least one of metallic oxide, metallic nitride, and metallic oxynitride.

6. The method of claim 1, wherein depositing the barrier layer further comprises:
   depositing at least one of $SiO_2$, $HfO_2$, $TiO_2$, $Ta_2O_5$, $Al_2O_3$, $BaTiO_3$, $BaSrTiO_3$, $PbZrTiO_3$, and $BaPbZrTiO_3$.

7. The method of claim 1, wherein depositing the barrier layer further comprises:
   depositing at least one of SiN, SiC, $SiO_xN_y$, SiC:H, S—C—H film, Si—N—H, Si—O—H, Si—C—N—H, Si—O—C—H, and Si—O—N—H.

8. The method of claim 1, wherein exposing the deposited barrier layer to the processing gas further comprises:
   exposing the deposited barrier layer to steam.

9. The method of claim 1, wherein exposing the deposited barrier layer to the processing gas further comprises:
   exposing the deposited barrier layer to at least one of ozone, oxygen, water vapor, heavy water, a peroxide, and hydroxide-containing compound.

10. A method of forming a through substrate via, the method comprising:
    depositing a barrier layer in a hole formed in a feature side of a substrate, the feature side opposite a backside of the substrate, wherein the hole comprises an aspect ratio of at least 10:1;
    annealing the deposited barrier layer by:
       exposing the deposited barrier layer to a processing gas at a pressure greater than about 2 bars; and
       maintaining a temperature of the substrate between about 150 degrees and about 700 degrees Celsius while in the presence of the processing gas, wherein the annealing replaces oxygen atoms having a first isotope in the deposited barrier layer with oxygen atoms having a second isotope that is higher than the first isotope to densify the deposited barrier layer;
    filling the hole with a conductive material on top of the barrier layer; and
    thinning the substrate from the backside to expose the conductive material.

11. The method of claim 10, wherein exposing the deposited barrier layer to the processing gas further comprises:
    exposing the deposited barrier layer to the processing gas at a pressure greater than about 5 bars.

12. The method of claim 10, wherein exposing the deposited barrier layer to the processing gas further comprises:
    exposing the deposited barrier layer to the processing gas at a pressure between about 5 to about 60 bars.

13. The method of claim 10, wherein maintaining the temperature of the substrate further comprises:
    maintaining the temperature of the substrate between 150 and about 600 degrees Celsius.

14. The method of claim 10, wherein depositing the barrier layer further comprises:
    depositing at least one of metallic oxide, metallic nitride, and metallic oxynitride.

15. The method of claim 10, wherein depositing the barrier layer further comprises:
    depositing at least one of $SiO_2$, $HfO_2$, $TiO_2$, $Ta_2O_5$, $Al_2O_3$, $BaTiO_3$, $BaSrTiO_3$, $PbZrTiO_3$, and $BaPbZrTiO_3$.

16. The method of claim 10, wherein depositing the barrier layer further comprises:
    depositing at least one of SiN, SiC, $SiO_xN_y$, SiC:H, S—C—H film, Si—N—H, Si—O—H, Si—C—N—H, Si—O—C—H, and Si—O—N—H.

17. The method of claim 10, wherein exposing the deposited barrier layer to the processing gas further comprises:
    exposing the deposited barrier layer to steam.

18. The method of claim 10, wherein exposing the deposited barrier layer to the processing gas further comprises:
    exposing the deposited barrier layer to at least one of ozone, oxygen, water vapor, heavy water, a peroxide, and hydroxide-containing compound.

* * * * *